(12) United States Patent
Reiss et al.

(10) Patent No.: US 7,030,473 B2
(45) Date of Patent: Apr. 18, 2006

(54) SUBSTRATE-BASED IC PACKAGE

(75) Inventors: Martin Reiss, Ottendorf-Okrilla OT Medingen (DE); Steffen Kroehnert, Dresden (DE)

(73) Assignee: Infineon Technologies AG, Munich (DE)

( * ) Notice: Subject to any disclaimer, the term of this patent is extended or adjusted under 35 U.S.C. 154(b) by 64 days.

(21) Appl. No.: 10/868,516

(22) Filed: Jun. 15, 2004

(65) Prior Publication Data

US 2004/0256705 A1    Dec. 23, 2004

(30) Foreign Application Priority Data

Jun. 17, 2003    (DE) .............................. 103 27 515

(51) Int. Cl.
*H01L 23/495*    (2006.01)
*H01L 23/48*    (2006.01)
*H01L 23/52*    (2006.01)
*H01L 29/40*    (2006.01)

(52) U.S. Cl. ...................... 257/666; 257/676; 257/737; 257/738; 257/778

(58) Field of Classification Search ........ 257/666–667, 257/678, 684, 690, 737–738, 778
See application file for complete search history.

(56) References Cited

U.S. PATENT DOCUMENTS

| 6,048,755 | A | 4/2000 | Jiang et al. |
| 6,297,543 | B1 * | 10/2001 | Hong et al. ................. 257/666 |
| 6,531,763 | B1 * | 3/2003 | Bolken et al. .............. 257/667 |
| 6,667,560 | B1 | 12/2003 | Goh |
| 6,724,076 | B1 | 4/2004 | Kahlisch et al. |
| 2002/0030288 | A1 | 3/2002 | Murata |

FOREIGN PATENT DOCUMENTS

DE    199 54 888 A1    5/2001
EP    0 810 655 A2    12/1997

* cited by examiner

*Primary Examiner*—Cuong Nguyen
(74) *Attorney, Agent, or Firm*—Slater & Matsil, L.L.P.

(57) ABSTRACT

The invention relates to a substrate-based IC package that includes a substrate on which a chip is mounted with a die attach material. The substrate is provided with a solder resist and has, on the side opposite the chip, conductor tracks provided with soldering globules. The conductor tracks are electrically coupled to the chip via wire jumpers, which extend through a bond channel which is filled with a mold compound. The chip and the substrate are encapsulated with a mold cap on the chip side. The substrate is provided with spacers for supporting a printing template for applying the die attach material. A strip of a solder resist that surrounds at least the bond channel gaplessly with essentially the same width is provided as the spacer.

12 Claims, 2 Drawing Sheets

SUBSTRATE-BASED IC PACKAGE

This application claims priority to Germany Patent Application 103 27 515.0, which was filed Jun. 17, 2003 and is incorporated herein by reference.

TECHNICAL FIELD

The present invention relates generally to device packaging, and more particularly to a substrate-based integrated circuit package.

BACKGROUND

Substrate-based integrated circuit (IC) packages include BGA packages, BGA standing for Ball Grid Array. In U.S. Pat. No. 6,048,755 A, a method for producing a BGA package by using a substrate with a patterned solder resist mask is described. In this arrangement, a number of IC packages can be arranged on a common substrate strip (matrix strip).

In such substrate-based IC packages, the mold cap (covering material or mold compound) is used to protect the chip edges since cracks or other mechanical damage can also affect the active chip side. Such damage can be produced during the handling, during the back-end process and also at the customer. The mold cap encloses the back of the chip and adjoining areas of the substrate.

In these IC packages, the chip can be fixed on the substrate in different ways. Thus, the chips are mounted, for example, by means of a tape or a printed or dispensed adhesive. It is particularly effective to print the adhesive onto the substrate by interposing a printing template and then to bond the chip to the substrate. To ensure a reliable adhesive printing process in this case, particularly on matrix substrates, the solder resist is omitted in the package area on the chip side. This additionally impedes contamination and a sufficient support area is created for the printing template used during the printing process. Matrix substrates are understood to be substrates, which are provided for accommodating a multiplicity of chips.

The adhesive has been previously printed with the aid of a squeegee and a printing template onto substrates, which were covered with solder resist over the whole area or at least most of the area on the chip side. However, this results in the risk, particularly in substrates with a bond channel, that during the die attach process (chip assembly process) contamination of the wire bond area on the chip can occur due to flowing of the adhesive. The adhesive can flow over the edge of the bond channel to the vicinity of the bond pad on the chip, which would have extremely negative effects for the wire bond process.

The applied adhesive was thus an additional layer on the solder resist. If then the solder resist is left off at least partially in the package area on the chip side, there is no support area (spacer) for the printing template, particularly in the case of matrix strips, and a cover with solder resist is necessary for process reasons (e.g., substrate warpage, mold sealing ring) on the substrate edge around the chip area. As a result, however, support area is lacking in the center of the matrix, which results in non-uniform bending of the printing template in the direction of the area to be printed. This also has the effect that the applied adhesive has a non-uniform thickness.

SUMMARY OF THE INVENTION

The preferred embodiment of the invention relates to a substrate-based IC package that includes a substrate on which a chip is mounted with a die attach material. The substrate is provided with a solder resist and has, on the side opposite the chip, conductor tracks provided with soldering globules. The soldering globules are connected to the chip via wire jumpers that extend through a bond channel, which is filled with a mold compound. The chip and the substrate are encapsulated with a mold cap on the chip side.

The preferred embodiment of the invention, therefore, provides for the creation of a substrate-based IC package in which the defects of the prior art are prevented. In one aspect, the invention provides a substrate-based IC package of the type initially mentioned in that the substrate is provided with spacers for supporting a printing template for applying a die attach material.

It is preferred to provide as spacer a strip of a solder resist, which surrounds at least the bond channel gaplessly with essentially the same width.

In a further embodiment of the invention, each bond channel is gaplessly surrounded by a strip of solder resist in the case of matrix substrates.

An advantage of the invention can be seen in the fact that the ring of a solder resist around the bond channel forms a flow barrier for the hybrid polyimide epoxy material used as adhesive that can emerge below the chip while it is being laminated. Furthermore, the spacers of the solder resist ensure a uniform distance of the printing template during the printing process so that the thickness of the adhesive is constant over the entire area of the matrix substrate.

A further advantage of the invention can be seen in the fact that the free space produced underneath the printing template due to the omission of the solder resist can be filled with adhesive in addition to the volume in the printing template.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
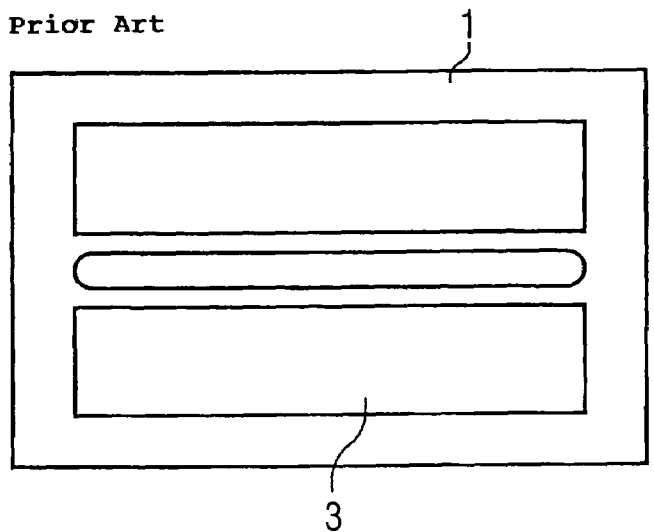
FIG. 1 shows a substrate for a substrate-based IC package according to the prior art.

FIG. 1 shows a substrate 1 with a central bond channel 2 for a substrate-based IC package according to the prior art. The substrate 1 is covered with a solder resist over the whole area on the chip side. An adhesive 3, also called die attach, is applied to the substrate 1 by printing in the area of the chip 5 to be mounted later (see e.g., FIG. 6). In the printing process, first a mask or printing template 4 (analogously to FIG. 4) is positioned on the substrate 1 and the adhesive 3 is applied with the aid of a squeegee. The adhesive 3 can also be applied by dispensing. The problem is that during the subsequent chip assembly process (die attach) contamination of the wire bond area on the chip can occur by the adhesive 3 flowing through the bond channel 2.

Figure 2:
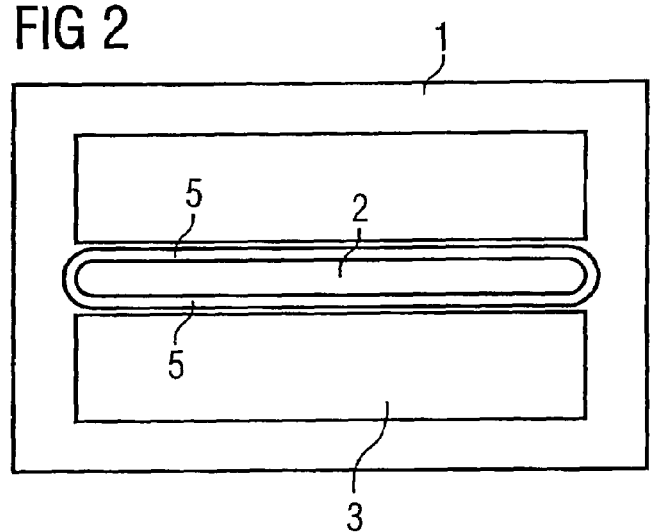
FIG. 2 shows a substrate according to the invention for an IC package.
Figure 3:
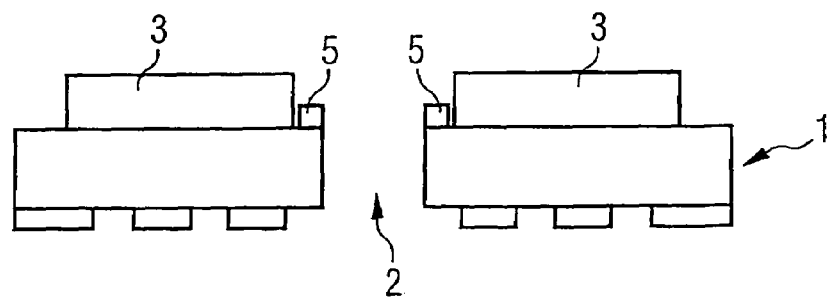
FIG. 3 shows a diagrammatic cross-sectional representation of the substrate according to FIG. 2.

FIG. 2 then shows a substrate 1 developed according to a first embodiment of the invention. In this embodiment, a strip 5 (or ring) of solder resist (or other material) has been left around the bond channel 2. This ring 5 is used, on the one hand, as support area for the printing template 4 and, on the other hand, as flow barrier for the adhesive 3. This also leads to an increase in the effective template thickness 8 (see FIG. 5), which leads to an increase in the bond line thickness, as shown in FIG. 3.

In one aspect, the invention provides the concept of leaving a ring 5 around the bond channel 2 in substrates 1 in which the solder resist is left off in the chip area on the chip side for reasons of reliability at chip and module level.

This ring then fulfills at least a threefold function. It is used as a template support and, at the same time, as flow barrier for the adhesive 3 during the assembly of the chip. In addition, the thickness of the adhesive is increased by the additional distance from the surface of the substrate 1 to be printed.

Figure 4:
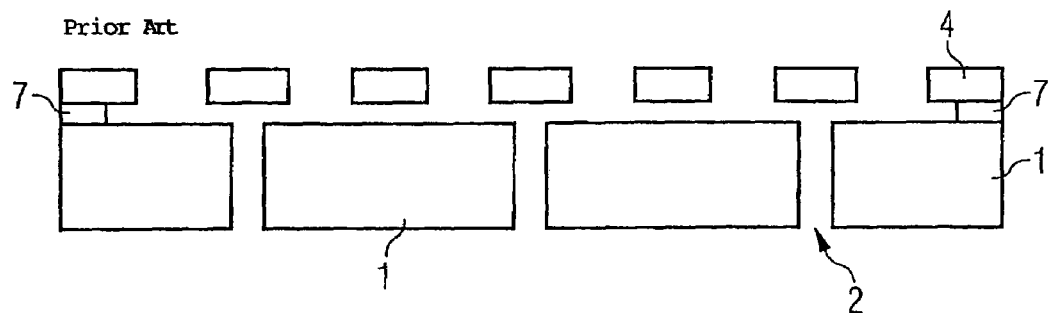
FIG. 4 shows a substrate in the form of a matrix strip according to the prior art.

FIG. 4 shows a matrix substrate 6 according to the prior art. A number of bond channels 2 with solder resist 7 are located in the edge area, on which a printing template 4 is resting. If adhesive is applied here by squeegee pressure, the printing template 4 bends through due to the squeegee pressure, which leads to a non-uniform height of the applied adhesive.

Figure 5:
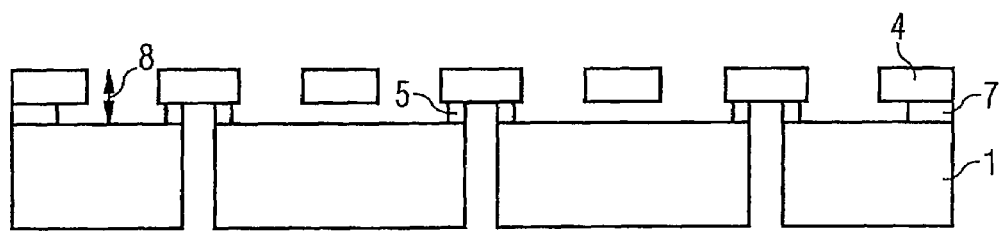
FIG. 5 shows a substrate in the form of a matrix strip with rings of solder resist.

FIG. 5 then shows the matrix substrate 6 with solder resist rings 5 applied according to the invention around each bond channel 2. Due to the rings 5, the printing template 4 has an additional support so that it will no longer bend through during the printing process and a uniform adhesive thickness is achieved over the entire matrix substrate. In addition, more adhesive 3 can be applied in the chip area so that the thickness of the adhesive is the result of the height of the solder resist 7 plus the thickness of the printing template 4. The consequence is better adhesion of the chip to be mounted.

Figure 6:
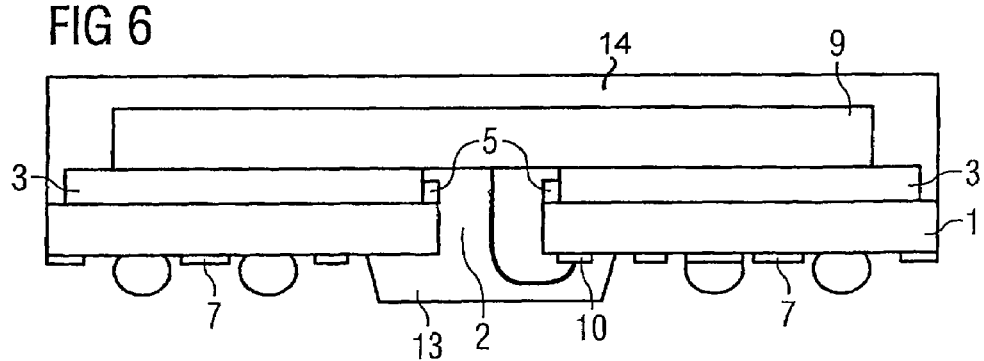
FIG. 6 shows a packaged semiconductor chip.

FIG. 6 shows a substrate-based integrated circuit package. In this embodiment, a semiconductor chip 9 is mounted on a substrate 1 with a die attach material 3. The substrate 1 is provided with a solder resist 7. The substrate 1 also has, on the side opposite the chip 9, conductor tracks 10 provided with soldering globules (or solder balls) 11. The conductor tracks 10 are electrically connected to the chip 9 via wire jumpers 12, which extend through the bond channel 2. A mold compound 13 fills the bond channel. The chip 9 and the substrate 1 are encapsulated with a mold cap 14 on the chip side. As discussed above, the substrate 1 is provided with spacers 5, e.g., for supporting a printing template (see FIG. 5) for applying the die attach material 3.

Table 1 provides a list of reference numbers used in the figures.

TABLE 1

| | |
|---|---|
| 1 | Substrate |
| 2 | Bond channel |
| 3 | Adhesive/Die attach |
| 4 | Printing template |
| 5 | Ring/Strip (Spacer) |
| 6 | Matrix substrate |
| 7 | Solder resist |
| 8 | Effective template thickness |
| 9 | Semiconductor chip |
| 10 | Conductor track |
| 11 | Soldering globule |
| 12 | Wire jumpers |
| 13 | Mold compound |
| 14 | Mold cap |

Although the present invention and its advantages have been described in detail, it should be understood that various changes, substitutions and alterations can be made herein without departing from the spirit and scope of the invention as defined by the appended claims.

What is claimed is:

1. A packaged integrated circuit comprising:
    a substrate including a bond channel formed in a center portion thereof;
    a spacer formed at a surface of the substrate and surrounding the bond channel;
    a die attach material disposed at the surface of the substrate; and
    a semiconductor chip disposed over the surface of the substrate such that the die attach material is between the semiconductor chip and the substrate.

2. The packaged integrated circuit of claim 1 wherein the spacer is formed of a solder resist material.

3. The packaged integrated circuit of claim 1 wherein the spacer surrounds the bond channel gaplessly.

4. The packaged integrated circuit of claim 1 wherein the spacer has a uniform width.

5. The packaged integrated circuit of claim 1 and further comprising a plurality of wire bonds extending through the bond channel and being attached to bond pads on the semiconductor chip at one end and to conductors on the substrate at another end.

6. The packaged integrated circuit of claim 5 and further comprising a material disposed within the bond channel and encapsulating the wire bonds.

7. The packaged integrated circuit of claim 1 and further comprising a molding compound that encapsulates the semiconductor chip.

8. A substrate-based integrated circuit (IC) package comprising:
    a substrate, the substrate being provided with a solder resist and having conductor tracks that are provided with soldering globules;
    a chip mounted on the substrate with a die attach material, wherein the substrate is provided with spacers for supporting a printing template for applying the die attach material;
    a plurality of wire jumpers which extend through a bond channel in the substrate and electrically couple the chip to the conductor tracks;
    a mold compound filling the bond channel; and
    a mold cap encapsulating the chip and the substrate.

9. The substrate-based IC package according to claim 8 wherein the spacer comprises a strip of a solder resist disposed on a surface of the substrate nearest the chip, the strip of solder resist surrounding at least the bond channel.

10. The substrate-based IC package according to claim 9 wherein the strip of solder resist surrounds the bond channel continuously.

11. The substrate-based IC package according to claim 10 wherein the spacer has a substantially uniform width around the bond channel.

12. The substrate-based IC package according to claim 8 wherein the substrate comprises one substrate in a matrix of substrates, each substrate including a bond channel, and wherein each bond channel is gaplessly surrounded by a strip of solder resist.

* * * * *